(12) United States Patent
Bortfeld et al.

(10) Patent No.: US 7,050,958 B1
(45) Date of Patent: May 23, 2006

(54) METHOD AND APPARATUS FOR ACCELERATING HARDWARE SIMULATION

(75) Inventors: Ulrich Bortfeld, Irvine, CA (US); Karl Andersson, Mission Viejo, CA (US)

(73) Assignee: ARM Limited, Cambridge (GB)

( * ) Notice: Subject to any disclaimer, the term of this patent is extended or adjusted under 35 U.S.C. 154(b) by 586 days.

(21) Appl. No.: 09/586,325

(22) Filed: Jun. 2, 2000

(51) Int. Cl.
*G06F 17/50* (2006.01)

(52) U.S. Cl. .............................. 703/15; 703/14; 703/16; 703/17

(58) Field of Classification Search ................. 703/15, 703/16, 14, 17; 710/24
See application file for complete search history.

(56) References Cited

U.S. PATENT DOCUMENTS

| | | | | |
|---|---|---|---|---|
| 5,732,192 A | * | 3/1998 | Malin et al. ..................... | 703/2 |
| 5,732,247 A | * | 3/1998 | Dearth et al. ................... | 703/13 |
| 5,768,567 A | | 6/1998 | Klein et al. | |
| 5,771,370 A | | 6/1998 | Klein | |
| 5,870,585 A | * | 2/1999 | Stapleton ....................... | 703/15 |
| 5,881,267 A | * | 3/1999 | Dearth et al. ................... | 703/27 |
| 6,053,947 A | * | 4/2000 | Parson .......................... | 703/14 |
| 6,154,719 A | * | 11/2000 | Saitoh et al. ................... | 703/13 |
| 6,182,258 B1 | * | 1/2001 | Hollander ...................... | 714/739 |
| 6,195,627 B1 | * | 2/2001 | Bargh et al. ................... | 703/14 |
| 6,295,517 B1 | * | 9/2001 | Roy et al. ...................... | 703/15 |
| 6,466,898 B1 | * | 10/2002 | Chan ............................ | 703/17 |

OTHER PUBLICATIONS

Jeff McAffer, "A Unified Distributed Simulation System", Proceedings of the Winter Simulation Conference, 1990, pp. 415-422.*

* cited by examiner

*Primary Examiner*—Paul L. Rodriquez
*Assistant Examiner*—Dwin M. Craig
(74) *Attorney, Agent, or Firm*—Farjami & Farjami LLP

(57) ABSTRACT

A method for accelerating hardware simulation is presented wherein cycle based simulations of digital system designs are generated by raising the level of abstraction in a hardware simulation environment. Behavioral models of the digital system components are created in a high level general purpose programming language. Function calls created in a high level general purpose programming language provide a transaction based communication interface. During a simulation of the system design, the behavioral models communicate with each other through the transaction based communication interface. Additionally, the behavioral models employ an execute and update method of instruction processing that generates cycle accurate information for the simulation.

8 Claims, 10 Drawing Sheets

METHOD AND APPARATUS FOR ACCELERATING HARDWARE SIMULATION

RELATED APPLICATION

The present application relates to co-pending United States patent application of concurrent ownership entitled "METHOD AND APPARATUS FOR UNIFIED SIMULATION," Ser. No. 09/586,433 filed on Jun. 2, 2000 and which is hereby incorporated by reference in its entirety.

BACKGROUND OF THE INVENTION

1. Field of the Invention

The present invention relates generally to the field of digital design system verification and more specifically relates to advanced simulation techniques for digital system designs.

2. Related Art

In the electronic design automation ("EDA") market today, the general design cycle for digital systems involves creating a design for the system, validating the design, and then manufacturing the system. The validation process is the focus of the present invention.

Currently, system designs are validated using one of two methodologies. The first method involves creating a physical hardware replica of the design on a test board. This method is referred to as emulation. In today's world of system-on-a-chip ("SOC") designs, the emulation method is becoming increasingly untenable. Typically, the physical replication of a chip design on a test board uses discrete physical components to mimic components that the design engineers have integrated into the chip design. Therefore, an interface that does not exist in the design must be placed between the discrete components of the physical test board.

Because such an interface does not exist in the actual design, test boards are increasingly divergent from the designs they intend to replicate. Another drawback of using test boards is the lead time required to build a physical test board and the lead time required to create the necessary interfaces between the components of the system. This additional delay, which typically can be as much several months per test board, so significantly increases the time for each iterative refinement step in the design cycle that emulation is nearly too burdensome to be useful in today's competitive reduced time-to-market environment.

Additionally, interfaces to the memory components used on a test board are typically not the same as the memory interfaces used in the design. This is often due to the fact that test boards use standard memory chips rather than the actual memory incorporated into the design. The use of these standard memory chips and their attendant interfaces further deviates the physical test board model from the actual design. For at least these reasons, the use of physical test boards to emulate electronic system designs is not very desirable.

The second method for validating a system design involves running a system simulation model on a computer. In order to perform a simulation, the system design is typically modeled using a hardware description language ("HDL") such as Verilog®. Alternatively, a system model can be created using the very high speed integrated circuit hardware description language ("VHDL").

Simulations can be performed on an abstract HDL or VHDL (collectively "HDL") based system model without the need for a physical hardware prototype. In this way, the behavior of a system design can be replicated in software such that a virtual simulation environment can accurately describe the characteristics of the newly designed system. Therefore, the typical problems associated with a physical test board can be overcome by executing an HDL system model in a virtual hardware simulation environment.

For example, it may only require a few days to create an HDL system model while creation of a physical test board typically may require several months. Also, it may only require a few hours to create an iterative second version HDL system model versus the several months required to create a similar second version test board.

Additionally, an HDL system model does not impose the use of non-existent interfaces between components because the model describes the components as they exist in the design. Furthermore, a HDL system model can accurately define the characteristics of the memory actually included in the design, rather than using standard memory modules. This eliminates the non conforming interfaces required by the use of standard memory chips on physical test boards.

However, although a system model has definite advantages over a physical test board, it has several drawbacks. With the growing complexity of systems comprising a mix of micro controllers, digital signal processors ("DSP"), random access memory ("RAM"), read only memory ("ROM"), dedicated logic, and various other interconnected components, the simulation of a system design has become a bottleneck in the total system design process. Complete system validation of an HDL system model is therefore impracticable for today's complex SOC devices.

Thus, a considerable drawback of an HDL system model is a significantly increased simulation time for complex SOC devices. For example, a physical test board will typically run about 10 times slower than the production version of the design being simulated. An HDL system model, on the other hand, will typically run about 1,000,000 times slower than the production version of the design being simulated. This significant difference in simulation speed considerably lengthens the amount of time needed for a system simulation environment to execute an HDL system model, thereby limiting the amount of system validation in today's reduced time-to-market environment.

Although in the past, moving to higher levels of abstraction and ignoring some level of detail in the system models has moderately increased the speed of simulations, the complexity of the designs being simulated has similarly increased. For example, in the late 1980's, gate level simulators typically offered a relatively low performance, measured in instructions per second ("IPS"). In the early 1990s, register transfer level ("RTL") simulators considerably improved performance. More recent system models created in HDL have additionally improved performance. However, because today's more complex designs typically require thousands of lines of code and millions of clock cycles to validate any significant portion of the system design, an average simulation run may take hours or even days to complete.

Another drawback of the HDL system model is that virtual simulations are event driven. For example, to simulate a simple read instruction within a processor, an HDL system model creates several separate events. Cumulatively, all of these events require that the computer running the simulation environment execute an extremely large number of instructions, which in turn causes the HDL system model to run about 1,000,000 times slower than the production version of the design being simulated. Additionally, all of the events in a HDL system model create an extremely granular level of detail that is not required by a design engineer to examine the success of a system model during and after the simulation run.

Therefore, what is needed is a method and apparatus that overcomes these significant problems found in the conventional systems as described above.

SUMMARY OF THE INVENTION

The present invention provides a significant improvement over the current method of HDL system models for simulation of electronic system designs. The present invention successfully introduces a higher level of abstraction than existing HDL system models. The new higher level of abstraction employed by the present invention creates a new paradigm for HDL simulation environments, moving away from the detail saturated event driven simulations of the past.

The new paradigm, which performs cycle accurate simulations, significantly reduces the number of instructions required to simulate a system design in a cycle based simulation environment. Correspondingly, a significant reduction in total simulation time is also realized. This increase in simulation speed allows the present invention to simulate designs approximately 100 times faster than conventional HDL simulation environments.

Such a significant increase in simulation speed has been realized by using a higher level of abstraction in the system model and the simulation environment. The HDL simulation environment has been replaced with a cycle based simulation environment adapted to a high level programming language paradigm. Individual components of a system model may now be created in a high level, high power programming language, for example C or C++. Furthermore, the pin based communication of conventional HDL simulation environments and their attendant sub-cycle events have been replaced with high level programming language function calls, while maintaining cycle accurate detail in the simulation.

In conventional HDL simulation environments, communication between a processor component and a memory component was necessarily event based. Event based communication requires the simulation environment to execute instructions corresponding to each signal change comprising each communication between a processor component and a memory component. The present invention abstracts the collection of these signal changes that comprise an event into discrete transaction based interfaces, thereby allowing the simulation to complete each transaction with a simple function call. Thus, the number of operations required to simulate a memory lookup (and many other frequently repeated transactions) have been significantly reduced by the present invention.

BRIEF DESCRIPTION OF THE DRAWINGS

The details of the present invention, both as to its structure and operation, can best be understood in reference to the accompanying drawings, in which like reference numerals refer to like parts, and in which.

DETAILED DESCRIPTION OF THE INVENTION

The present invention is directed toward a method for accelerating the simulation process for electronic system designs. After reading this description it will become apparent to one of ordinary skill in the art how to implement the invention in alternative embodiments and alternative applications. As such, this detailed description of various alternative embodiments should not be construed to limit the scope or breadth of the present invention.

I. Introduction

The increasing complexity of the current generation of system designs requires high speed system validation models. A system validation model may be a physical prototype, such as a system emulation board. A system validation model may also be a system simulation model created with the aid of computer software. A system simulation model that mimics the design of a particular system is known as a virtual prototype. A virtual prototype can model, for example, an SOC system with complete accuracy while simulating extremely fast and maintaining cycle accurate output information.

Typically, virtual prototypes can be written in a general purpose programming language. For example, in one embodiment a hardware simulation model could be written in C or C++. The simulation speed of these models can be several orders of magnitude above the simulation speed currently achieved by conventional HDL system models for comparable designs. Furthermore, unlike conventional instruction set simulators ("ISS"), virtual prototypes may accurately represent complete systems with multiple processors, DSPs, peripherals and their corresponding memory systems.

Virtual prototypes may also play an important role in design activities like architecture exploration, design validation and performance analysis. A virtual prototype may also be used as an executable specification for the hardware implementation process. Additionally, a virtual prototype can be used as a development platform for integrating software components into the hardware design.

Figure 1:
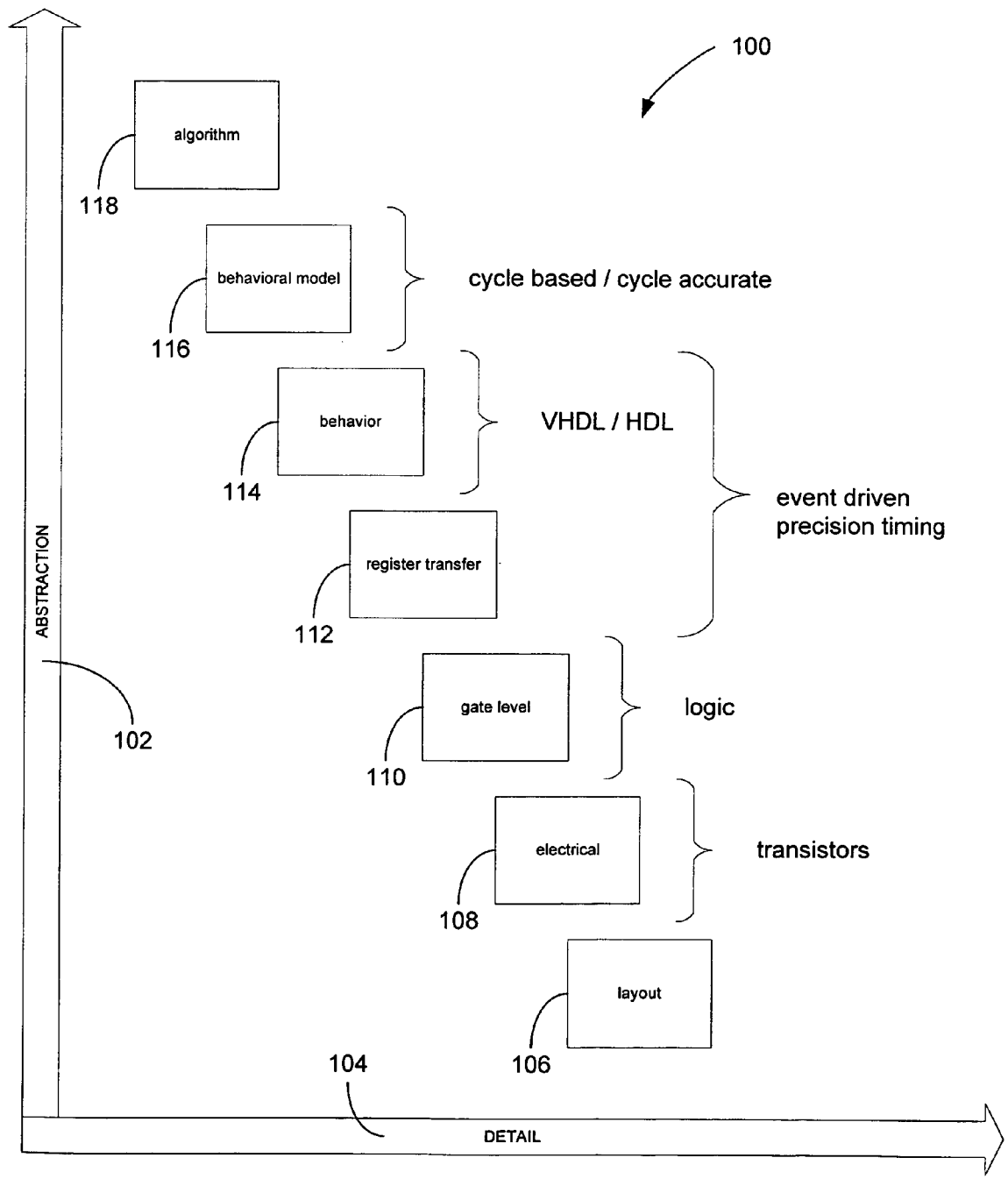
FIG. 1 is a block diagram illustrating increasing levels of abstraction and increasing levels of detail in hardware simulation models according to an embodiment of the present invention.

FIG. 1 is a graph illustrating increasing levels of abstraction and increasing levels of detail in hardware simulation models. Graph 100 is comprised of an abstraction axis 102 and a detail axis 104. There is an inverse relationship between the levels of abstraction and detail. A hardware system model that has a significant amount of detail, for example, will necessarily have a low level of abstraction. Conversely, a hardware system model with a very high level of abstraction will have a diminished level of detail.

Additionally, there is an inverse relationship between the level of detail in a hardware system model and the speed at which that model can be simulated. For example a hardware system model with a very high level of abstraction will simulate extremely fast in comparison to a system model with a very high level of detail. Therefore, it is desirable to create hardware system models with the highest possible level of abstraction while maintaining enough detail to verify the design.

In general, there are seven levels of abstraction in hardware system modeling. Layout level 106 has the highest amount of detail. Electrical level 108 increases the abstraction level yet maintains detail to the level of individual components such as transistors within the design. Gate level 110 also increases the level of abstraction, while providing detail to the granularity of logic gates contained within the design.

Register transfer level 112 and behavior level 114 both have a considerable level of detail while increasing the abstraction level to a point where simulation times may be reasonable. Current hardware system models are created in HDL at the behavioral and register transfer levels of abstraction. This level of abstraction causes an HDL system model to simulate at an event driven level of detail that provides precise timing correlation with the virtual system clock during simulation. In a high level system simulation environment, however, too much information may be generated at this event driven level of detail and the speed of the simulation may still be too slow.

At the behavioral model level 116, the level of abstraction is sufficiently higher to increase the speed of the simulation by an order of magnitude. Furthermore, the level of detail provided is based on each cycle of the virtual system clock in a simulation. This provides cycle accurate detail that is sufficient to verify a system design. The highest level of abstraction, algorithm level 118, does not provide enough detail to accurately verify a system design.

In one embodiment, the cycle based simulations of the cycle accurate behavioral model level 116 raises the level of abstraction in hardware simulation models. As a result, the event driven HDL simulations with their corresponding thousands of lines of code and millions of instructions are no longer required. This advantageously results in significantly reduced simulation times. A drawback of the higher abstraction level is a slight reduction in the sub-cycle event timing accuracy. However, the granular detail of sub-cycle events is typically not required by design engineers in the early phases of a system design process.

In an alternative embodiment of a cycle accurate simulation, transaction based interfaces model the communication between components as function calls. Rather than simulating each event that comprises a single transaction between two system components or sub-components, the present invention employs a set of function calls in an abstract software interface. For example, transaction based communication enables higher simulation speeds than event based communications because transaction based communications cause the computer running the cycle based simulation environment to execute a single instruction (the function call) per transaction. Conversely, event driven communications cause the computer running the HDL simulation environment to execute an instruction for each sub-cycle event that comprises the transaction. Consequently, transaction based interfaces significantly speed up the simulation process for virtual prototypes.

Figure 1A:
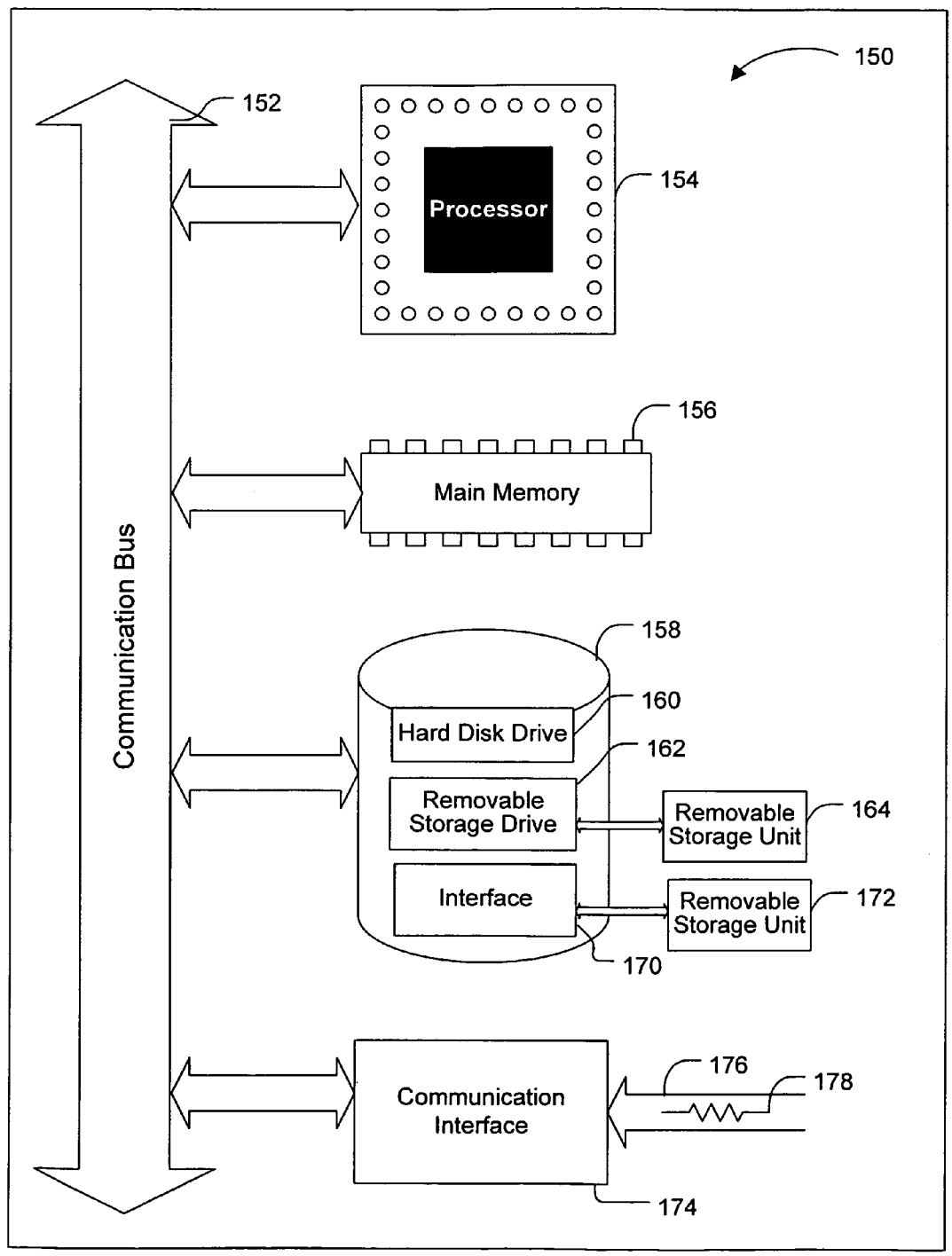
FIG. 1A is block diagram illustrating an exemplary computer system in which elements of the present invention may be implemented according to one embodiment of the present invention.

FIG. 1A is a block diagram illustrating an exemplary computer system 150 in which elements and functionality of the present invention are implemented according to one embodiment of the present invention. The present invention may be implemented using hardware, software, or a combination thereof and may be implemented in a computer system or other processing system. An exemplary computer system 150 is shown in FIG. 1A. Various software embodiments are described in terms of this exemplary computer system 150. After reading this description, it will become apparent to a person having ordinary skill in the relevant art how to implement the invention using other computer systems and/or computer architectures.

The computer system 150 includes one or more processors, such as processor 154. Additional processors may be provided, such as an auxiliary processor to manage input/output, an auxiliary processor to perform floating point mathematical operations, a special-purpose microprocessor having an architecture suitable for fast execution of signal processing algorithms ("digital signal processor"), a slave processor subordinate to the main processing system ("back-end processor"), an additional microprocessor or controller for dual or multiple processor systems, or a coprocessor. It will be recognized that such auxiliary processors may be discrete processors or may be integrated with the processor 154.

The processor 154 is connected to a communication bus 152. The communication bus 152 may include a data channel for facilitating information transfer between storage and other peripheral components of the computer system 150. The communication bus 152 further provides the set of signals required for communication with the processor 154, including a data bus, address bus, and control bus (not shown). The communication bus 152 may comprise any known bus architecture according to promulgated standards, for example, industry standard architecture (ISA), extended industry standard architecture (EISA), Micro Channel Architecture (MCA), peripheral component interconnect (PCI) local bus, standards promulgated by the Institute of Electrical and Electronics Engineers (IEEE) including IEEE 488 general-purpose interface bus (GPIB), IEEE 696/S-100, and the like.

Computer system 150 includes a main memory 156 and may also include a secondary memory 158. The main memory 156 provides storage of instructions and data for programs executing on the processor 154. The main memory 156 is typically semiconductor-based memory such as dynamic random access memory (DRAM) and/or static random access memory (SRAM). Other semiconductor-based memory types include, for example, synchronous dynamic random access memory (SDRAM), Rambus dynamic random access memory (RDRAM), ferroelectric random access memory (FRAM), and the like, as well as read only memory (ROM).

The secondary memory 158 may include a hard disk drive 160 and/or a removable storage drive 162, for example a floppy disk drive, a magnetic tape drive, an optical disk drive, etc. The removable storage drive 162 reads from and/or writes to a removable storage unit 164 in a well-known manner. Removable storage unit 164 may be, for example, a floppy disk, magnetic tape, optical disk, etc. which is read by and/or written to by removable storage drive 162. As will be appreciated, the removable storage unit 164 includes a computer usable storage medium having stored therein computer software and/or data.

In alternative embodiments, secondary memory 158 may include other similar means for allowing computer programs or other instructions to be loaded into the computer system 150. Such means may include, for example, a removable storage unit 172 and an interface 170. Examples of secondary memory 158 may include semiconductor-based memory such as programmable read-only memory (PROM), erasable programmable read-only memory (EPROM), electrically erasable read-only memory (EEPROM), or flash memory (block oriented memory similar to EEPROM). Also included are any other removable storage units 172 and interfaces 170, which allow software and data to be transferred from the removable storage unit 172 to the computer system 150.

Computer system 150 also includes a communication interface 174. Communication interface 174 allows software and data to be transferred between computer system 150 and external devices, networks or information sources. Examples of communication interface 174 include a modem, a network interface (such as an Ethernet card), a communications port, a PCMCIA slot and card, an infrared interface, etc. Communication interface 174 preferably implements industry promulgated architecture standards, such as Ethernet IEEE 802 standards, Fibre Channel, digital subscriber line (DSL), asymmetric digital subscriber line (ASDL), frame relay, asynchronous transfer mode (ATM), integrated digital services network (ISDN), personal communications services (PCS), transmission control protocol/Internet protocol (TCP/IP), serial line Internet protocol/point to point protocol (SLIP/PPP), and so on. Software and data transferred via communication interface 174 are in the form of signals 178 which may be electronic, electromagnetic, optical or other signals capable of being received by communication interface 174. These signals 178 are provided to communication interface 174 via a channel 176. This channel 176 carries signals 178 and can be implemented using wire or cable, fiber optics, a phone line, a cellular phone link, a radio frequency (RF) link, or other communications channels.

Computer programming instructions (also known as computer programs or software) are stored in the main memory 156 and/or the secondary memory 158. Computer programs can also be received via communication interface 174. Such computer programs, when executed, enable the computer system 150 to perform the features of the present invention as discussed herein. In particular, the computer programs, when executed, enable the processor 154 to perform the features and functions of the present invention. Accordingly, such computer programs represent controllers of the computer system 150.

In this document, the term "computer program product" is used to refer to any media used to provide programming instructions to the computer system 150. Examples of these media include removable storage units 164 and 172, a hard disk installed in hard disk drive 160, and signals 178. These computer program products are means for providing programming instructions to the computer system 150.

In an embodiment where the invention is implemented using software, the software may be stored in a computer program product and loaded into computer system 150 using hard drive 160, removable storage drive 162, interface 170 or communication interface 174. The software, when executed by the processor 154, causes the processor 154 to perform the features and functions of the invention as described herein.

In another embodiment, the invention is implemented primarily in hardware using, for example, hardware components such as application specific integrated circuits ("ASICs"). Implementation of the hardware state machine so as to perform the functions described herein will be apparent to persons having ordinary skill in the relevant art.

In yet another embodiment, the invention is implemented using a combination of both hardware and software. It is understood that modification or reconfiguration of the computer system 150 by one having ordinary skill in the relevant art does not depart from the scope or the spirit of the present invention.

II. System Simulation Flow

The complexity of today's system design precludes a pure top down design, where a design engineer creates each component of the total system. Instead, today's system design process relies extensively on component and design reuse. For example, a large number of the components in a system design may be pre-designed building blocks, also referred to as intellectual property ("IP"). These IP blocks frequently originate from external third party IP vendors. A complication of this third party participation in the construction of a system simulation model has traditionally been the absence of an interface standard to link the various components of a system together.

Figure 2:
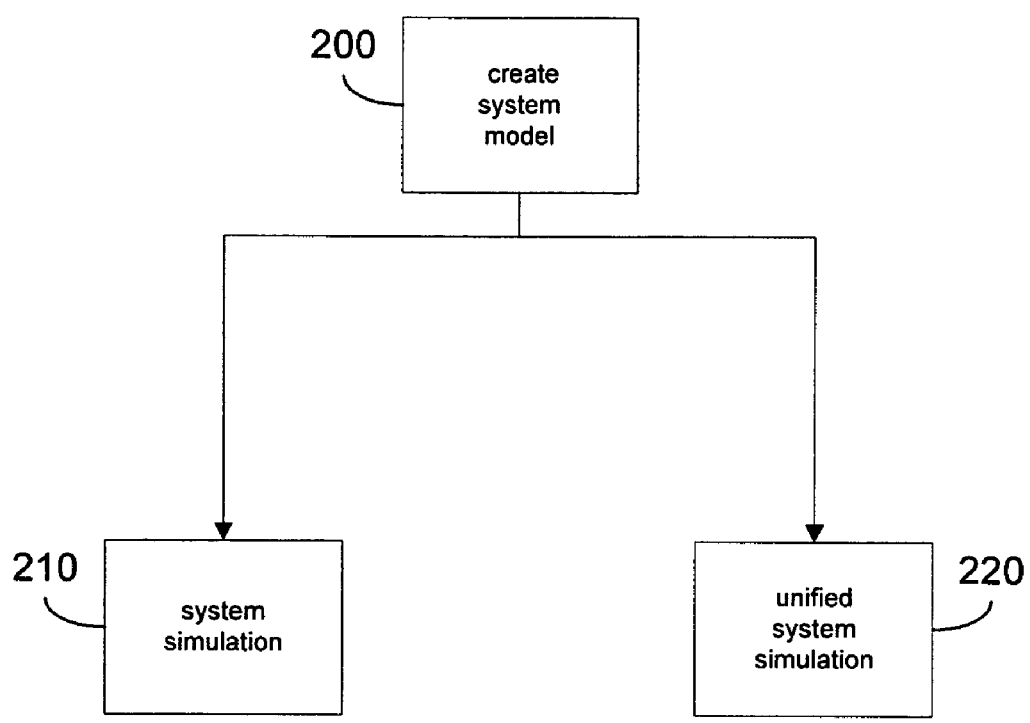
FIG. 2 is a flowchart illustrating an overview of a simulation environment flow for a hardware model simulation according to one embodiment of the present invention.

The overall flow of a system simulation may detail the high level steps desired to create a high performance system simulation model and execute that model in a cycle based simulation environment. FIG. 2 is a flowchart illustrating an example process for a system simulation flow. In one embodiment, these high level steps may be reflected in the system simulation interfaces.

The design of a system simulation flow may begin with the creation of a system model, as illustrated in step 200. For example, when modeling a system, a design engineer may elect to reuse existing component models from a component repository. Additionally, the design engineer may choose to integrate IP component models from a third party IP vendor or create component models from scratch. Ultimately, the result of the system designer's compilation of these components is the system model.

Once a system model has been created, it is used to run a system simulation, as illustrated in step 210. In one embodiment, the simulation step aids a design engineer in determining the behavior of the system model. For example, a simulation run may consist of executing the system model in a cycle based simulation environment, resulting in information regarding the behavior of the model under specific circumstances. An advantage of running cycle based simulations is that the amount of information generated by the a cycle accurate simulation provides enough detail to validate the performance of the system model, while running orders of magnitude faster than the more detail oriented levels of abstraction.

A system model may also be used in a unified simulation, as seen in step 220. In one embodiment, use of the system model in a unified simulation allows the system model to be integrated as a component into higher level system models. For example, a system model of a micro controller may be integrated as a component into a system model comprising the micro controller component, a digital signal processor component, and a memory component. The composite system model may then be simulated in the cycle based simulation environment.

In an alternative embodiment, use of the system model in a unified simulation allows application software to be loaded onto a memory component in the system model. For example, a low level operating system application may be loaded onto a memory component in the cycle based simulation environment. During the simulation, a processor component of the system model may simulate the operation of the operating system application by executing the instructions of the operating system. This allows a single cycle based simulation environment to simulate both the hardware components (memory and processor) as well as a software component (the operating system application).

A. Hierarchical System Modeling

In one embodiment, a system model may be comprised of top level components and the connections between those components. Each top level component may be described in terms of its sub-components and the connection between those sub-components. Furthermore, each sub-component may similarly be described in terms of its sub-components and the connection between those sub-components. Each level of sub-components that is described by a system model increases the level of detail in the system model and correspondingly decreases the level of abstraction for the model. As described above with reference to FIG. 1, higher levels of detail correspondingly increase the time needed to simulate the system model.

In a vsimulation environment, system models may be viewed as individual components. A system model, for example, could be viewed as a black box with a set of configuration parameters, and the ability to receive input and provide output. This relative view allows a system model to later be combined with other system models in a larger cycle based simulation environment.

Figure 3:
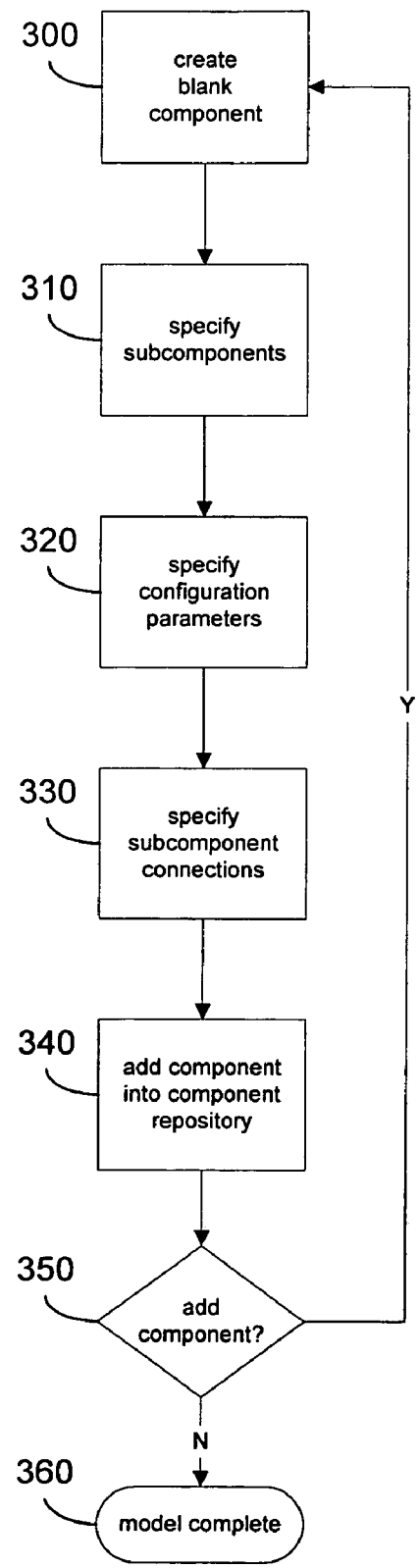
FIG. 3 is a flowchart illustrating a process for creating the components of a system model according to one embodiment of the present invention.

FIG. 3 is a flowchart illustrating a process for creating the components of a system model according to one embodiment of the present invention. In step 300, a blank component is first created as part of the system model. In one embodiment, this component may initially be an empty shell. After creating an empty component, for example, a design engineer may then specify the input and output ports as well as the configuration parameters for the component. In an alternative embodiment, each component comprising a system model has at least a system clock port. This allows the virtual system clock to connect to the component.

In step 310, sub-components may be added into the blank component. A design engineer may create the sub-component, integrate a third party IP sub-component, or select the sub-component from a component repository. The addition of sub-components into the blank component may also be referred to as instantiation. In one embodiment, a component may be comprised of sub-components originating from an in-house component repository, from third party IP providers, or created from scratch by a design engineer.

Once the sub-components have been instantiated in the component, in step 320 the sub-components are configured. In one embodiment, configuration of sub-components comprises specifying the available configuration parameters for a particular component. After configuring the sub-components, the sub-components are linked together, as illustrated in step 330. For example, a DSP sub-component may be connected to an RF signal receiver sub-component in a system model of a mobile communications device. Once the sub-components have been instantiated, configured, and connected, the component may be stored in the component repository for later use, as illustrated in step 340.

In one embodiment, the step of adding a component into the component repository further comprises pre-compiling shared objects, updating documentation, and updating release notes. In step 350, a design engineer may determine whether the system model includes additional components. If so, the process of creating a component may repeat. If no more components are required, the system model may be complete, as illustrated in step 360.

B. Simulation

Simulation of a hardware design allows a design engineer to analyze behavioral information pertaining to the design during and after the simulation run. For example, once a design has been created, a design engineer may create a system model for the design. This system model may also be referred to as a virtual prototype. A cycle based simulation environment may then execute the system model to generate information regarding the system model's responses to stimuli. Signals may be generated by a test bench, for example, to provide input and stimuli to the external pins and/or signals of the system model.

Figure 4:
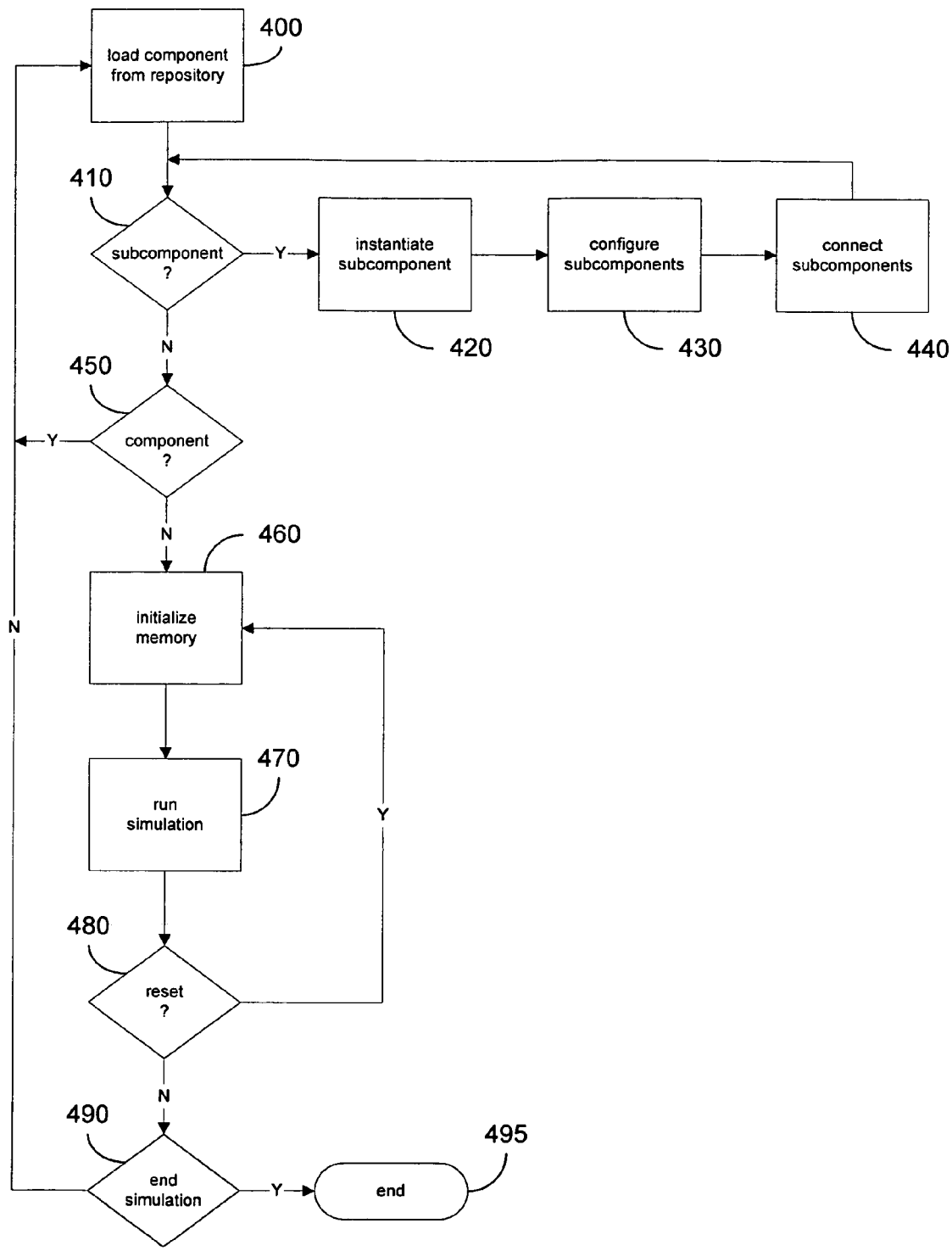
FIG. 4 is a flowchart illustrating a process for simulating a system model of a hardware design according to one embodiment of the present invention.

FIG. 4 is a flowchart illustrating a process for simulating a system model of a hardware design. The system model is comprised of components, as described above with reference to FIG. 3. In step 400, the cycle based simulation environment loads a component of the system model. For example, a component may be accessed in the component repository and loaded into the cycle based simulation environment. In one embodiment, only the top level components of the system model are loaded into the cycle based simulation environment. Hence, the sub-components of a component may not be loaded into the cycle based simulation environment. Instead, the sub-components may be derived, or elaborated from the top level components, by the cycle based simulation environment.

In step 410, the cycle based simulation environment determines if the component that has been loaded from the component library has any sub-components. If sub-components exist, those sub-components are instantiated, as illustrated in step 420. Once the sub-components have been instantiated, they are each configured and then connected to each other in steps 430 and 440, respectively.

For each sub-component, the cycle based simulation environment determines the presence of sub-components in step 410. If there are sub-components to the sub-component, they are instantiated, configured, and connected as described above. In this fashion, the cycle based simulation environment may recursively instantiate all of the sub-components that comprise the multi level design hierarchy. This process of instantiating, configuring, and connecting the sub-components may be referred to as elaboration.

In step 450, the cycle based simulation environment determines if the system model has any additional top level components. If there are additional components, the cycle based simulation environment may load the component and elaborate the sub-components until the entire design hierarchy is loaded.

Once all of the components and sub-components have been loaded into the cycle based simulation environment and connected, the memory space of the processor components can be initialized, as illustrated in step 460. In one embodiment, components may initialize the memory space of processor components only after the connections between the processor and the memory subsystems are in place.

In step 470, the simulation of the system model takes place. For example, during the execution of the system model in the cycle based simulation environment, the virtual system clock time is advanced through repeated run and step commands. In one embodiment, the virtual system clock keeps track of the simulation time. In an alternative embodiment, execution of the system model can revert the virtual system clock to time zero by resetting the system model, as illustrated in step 480. For example, if the system is reset, the simulation may return to step 460, where the memory is re-initialized for a "cold start." Alternatively, the system may not re-initialize the memory and only re-initialize the registers for a "warm start."

Execution of the system model in the vsimulation environment completes when the input data has been exhausted, as illustrated in step 490. Once the simulation has ended, the cycle based simulation environment can terminate or the simulator can be restarted and return to execute the same or another system model. In one embodiment, a restart of the cycle based simulation environment may be equivalent to exiting the simulation environment and beginning again. Alternatively, if the cycle based simulation environment is not restarted, the simulation ends, as illustrated in step 495.

A cycle based simulation environment allows a system model to be included as a component of a higher level system model. In this fashion, a system model can be simulated with its peer level components that together comprise a higher level system model.

In an alternative embodiment, a cycle accurate virtual prototype of a memory component may be instantiated in a cycle based simulation environment and then application software may be loaded into the memory component. For example, a low level operating system application software may be loaded into a memory component in a cycle based simulation environment. During the simulation, a processor component may simulate the operating system application by executing the instructions of the operating system application. This allows a single simulation to simulate both the hardware components (memory and processor) as well as a software component (the operating system application). In one embodiment, hardware components and software applications may be simultaneously simulated in a single cycle based simulation environment.

III. Simulation Interfaces

In a cycle based simulation environment, a system model with the top level components and sub-components is executed. Execution of a system model may verify, among other things, the communication between these components and sub-components. In the past, the communication between the components of conventional HDL system models was pin based. For example, any communication between a processor component and a memory component might cause signals to change on one or more pins connecting the two components. In an event driven simulation environment, each change of a signal is considered an event.

In one embodiment of the present invention, the events that comprise frequently repeated communications may be condensed into a single function call. A collection of related function calls may be referred to as an interface. Additionally, the interfaces that comprise a cycle based simulation environment may be logically separated into a control group and a peer group.

Figure 5:
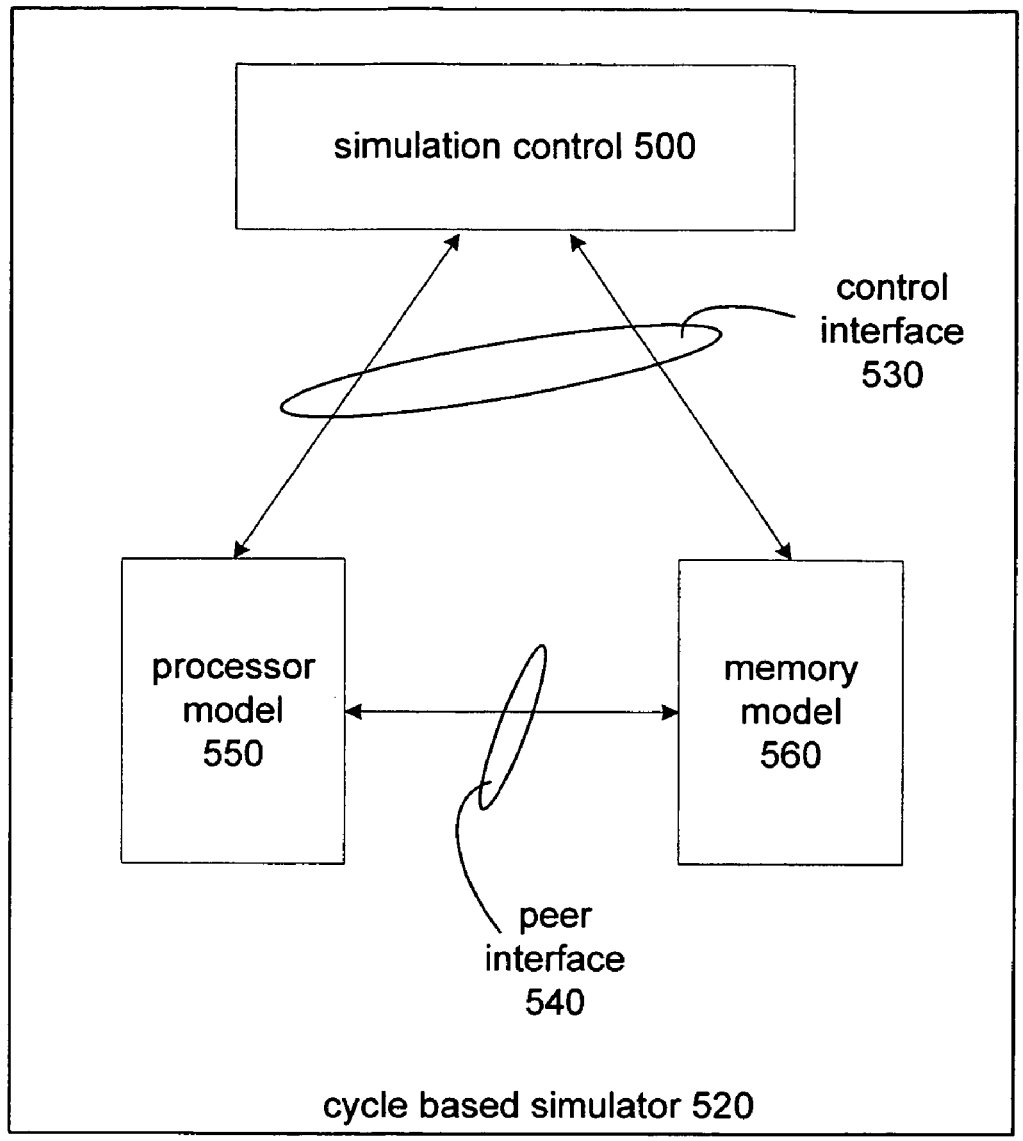
FIG. 5 is a block diagram illustrating a cycle based simulation environment according to one embodiment of the present invention.

FIG. 5 is a block diagram illustrating a conceptual overview of a cycle based simulator 520 with the interfaces separated into control and peer groups. The simulation control 500 may communicate with the processor model 550 and the memory model 560 to direct and manage the simulation session. In one embodiment, the interfaces that provide the channels for communication between the simulation control and the components of the system model may comprise the control interface 530.

Furthermore, during the course of a system simulation in a cycle based simulator 520, the processor model 550 may communicate with the memory model 560. In one embodiment, the interfaces that provide the channels of communication between the processor 550 and the memory 560 are part of the peer interface 540.

A. Control Interface

The control interface 530 of a simulation environment allows the simulation control 500 to manage the setup and connection of the components in a virtual prototype. In one embodiment, the function calls of the control interface 530 provide the simulation control 500 the necessary tools to load components, elaborate sub-components, and initialize and navigate through components and sub-components.

Referring back to FIG. 4, which illustrates a process for a simulation run, in one embodiment the control interface 530 may contain function calls for each discrete step in the simulation setup and initialization. For example, the control interface 530 may contain a function call for loading a component into the cycle based simulation environment, correlating to step 400. Moreover, in one embodiment, the control interface 530 may contain a function call for dynamically loading a component into the cycle based simulation environment. Advantageously, the control interface 530 may contain a function that may determine whether to load a component based on a parameter or variable input.

Control interface 530 may also contain a function call to allow the simulation control 500 to elaborate a component, correlating to step 420. A system model is typically constructed of top level components comprised of sub-components. Each sub-component may in turn be comprised of sub-components. In one embodiment the control interface 530 may contain a function call for elaborating a component. An elaborating function call may recursively instantiate, configure, and connect the sub-components in a multi-level design hierarchy.

In an alternative embodiment, the control interface 530 may contain a function call to configure each component and sub-component by setting its respective parameters. Such a function call might correlate to step 430 of FIG. 4. Certain configuration parameters may be used to customize a generic component model such as a standard memory component. In one embodiment, the simulation control 500 may configure a standard memory component by running a memory configuration function call from the control interface 530 and passing a width and a size parameter to the function call.

Additionally, when the simulation control 500 is setting up the cycle based simulation environment, the sub-components that have been instantiated and configured are connected. In one embodiment, a function call may exist in the control interface 530 that allows the simulation control 500 to perform this connection, correlating to step 440. The links between the components in a virtual prototype may represent physical interconnect structures between the components or peer control interfaces.

An initialization step may allow the simulation control 500 to reset the registers and memory of components in a virtual prototype. In one embodiment, an initialization function call may exist in the control interface 530 to provide the simulation control 500 the capability to reset the registers and memory of components, correlating to step 460. The initialization function call may reset each component in the virtual prototype to a well defined state. In one embodiment, a well defined state may be a "warm start" that involves resetting only the registers of the components in the virtual prototype. In an alternative embodiment, the well defined state may be a "cold start" that involves resetting both the registers and the memory of the components in the virtual prototype.

The control interface 530 may also contain a navigation function call that provides the simulation control 500 with the ability to navigate between components of the virtual prototype. For example, the simulation control 500 may navigate through the hierarchical component structure by calling a function that can access the parent or child components of any component in the hierarchy.

In addition to the control interface functions for managing the setup of the cycle based simulation environment, control interface 530 may also include function calls for directing the execution of a simulation. In one embodiment, function calls provide the simulation control 500 direct control of the simulation run and low level debugging.

For example, function calls may exist for certain simulation steps such as RUN, HALT, STEPCYCLE, QUIT and NOTIFY. In one embodiment, a NOTIFY function may be used by the hardware simulator 520 to signal the control simulator 500 that certain simulation events have occurred. For example, a component may call a function that notifies the control simulator 500 that a break condition has occurred. This notice may be provided by passing a predetermined parameter to the function. In an alternative embodiment, certain query functions may be employed by the simulation control 500 to obtain information about the simulation status and virtual system clock time. For example, reporting functions may allow components to display diagnostic messages of various severity levels.

In an alternative embodiment, function calls may allow components of the virtual prototype to communicate with programs external to the cycle based simulation environment, such as a debugger. A function may exist that allows the simulation control 500 to direct a component to receive asynchronous input on an inter process communication ("IPC") port. In this example, the component may then employ a separate function of the control interface 530 to read data from the IPC socket interface.

B. Peer Interface

In one embodiment, peer interface 540 may be comprised of those functions that facilitate communication between individual components of a virtual prototype in a cycle based simulation environment. As illustrated in FIG. 5A, for example, peer interface 540 may facilitate communication between processor model 550 and memory model 560 within cycle based simulator 520.

In one embodiment, peer interface 540 may be divided into three types of functions: clock, access, and signal functions. The clock functions are dedicated to synchronizing the computations of the individual components in a simulation model with the virtual system clock, thereby allowing the simulation to achieve cycle accurate behavior. Clock functions may account for nearly 50 percent of the total transactions in an average simulation.

The access functions are dedicated to handling data communications between components of a virtual prototype. The access functions may simulate all of the bus transactions in the cycle based simulator 520, and may account for nearly 40 percent of the total transactions in an average simulation.

The signal functions are dedicated to handling those transactions that do not fall into the clock or access function categories. For example, signal functions may exist in the peer interface 540 for an interrupt signal or a clock enable signal. Signal functions may account for 5 to 10 percent of the total transactions in an average simulation.

1. Access Functions

In one embodiment, access functions may be used to model system buses and may consist of several function calls. A breakdown of the access functions may reveal several functions that handle all of the registration type tasks, several functions that handle all of the transaction type tasks, and several functions that handle all of the debugging type tasks.

In one embodiment, two functions that handle transaction type tasks may be READ and WRITE. The READ function, for example, may have an address parameter, a data buffer parameter, and a control signal parameter. A processor component may use this READ function to access data in a memory component. The WRITE function may have the same parameters, thereby allowing a processor component to use the WRITE function to store data in a memory component.

A second set of debugging type functions may be provided for debugging access to the cycle based simulation environment. These functions may allow debugging programs to access a processor model's memory space without interfering with the simulated bus transfers. An advantage of this type of debugging access is to provide zero latency, non arbitrated access to the memory space. Furthermore, these functions may provide information about the address space to the debugging programs.

The registration functions may have two parameters that specify an address range. A bus master component may use this address range information in a registration function to select the components to which a transaction is directed. Advantageously, this selection may significantly narrow the field of recipient components and significantly reduce the overhead of bus transactions because only those components whose address range contains the address of the current transaction are sent the transaction.

Figure 6:
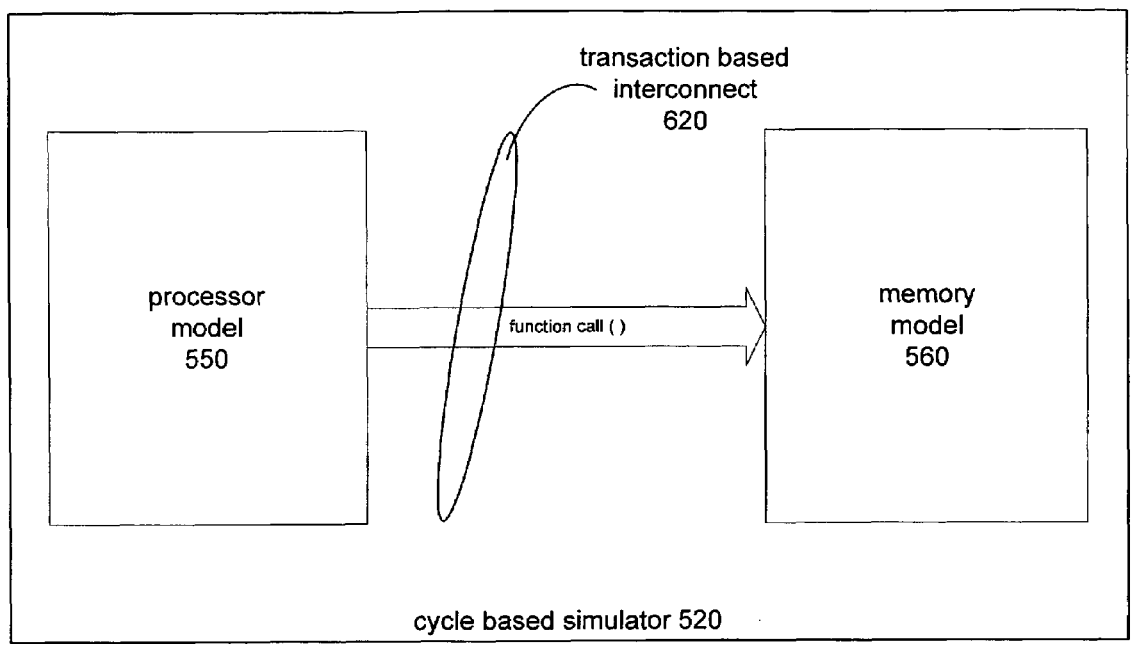
FIG. 6 is a block diagram illustrating a transaction-based interconnect for a cycle accurate behavioral system simulation environment according to one embodiment of the present invention.

FIG. 6 is a block diagram illustrating cycle accurate communication between components of a virtual prototype in a cycle based simulation environment. In one embodiment, processor model 550 is created using a high level general purpose programming language. For example, processor model 550 may be created using C or C++ to simulate a system processor component in cycle based simulator 520. Similarly, memory model 560 is created in a high level general purpose programming language such as, for example, C++ to simulate a system memory component in cycle based simulator 520.

Components 550 and 560 communicate with each other via transaction based interconnect 620. Transaction based interconnect 620 is preferably a subset of the high level general purpose programming language function calls that comprise the peer interface 540. In one embodiment, simulation of a simple read command using transaction based interconnect 620 may require one instruction in the simulation environment, namely a call to the READ function.

Figure 7:
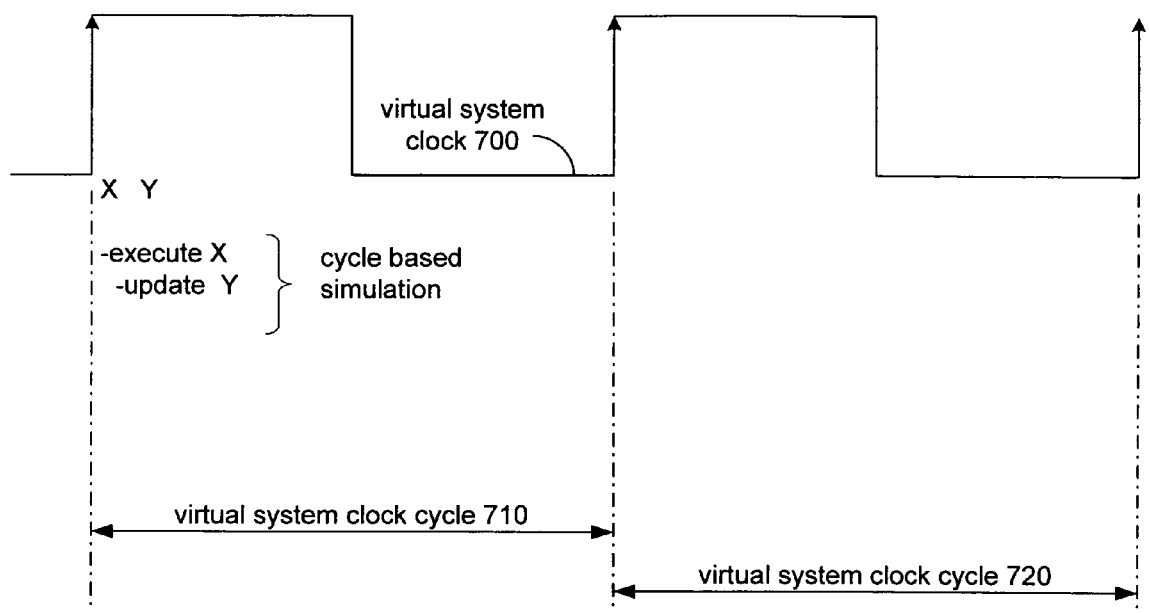
FIG. 7 is a block diagram illustrating two complete virtual clock cycles of a simulation environment according to one embodiment of the present invention.

FIG. 7 is a block diagram illustrating two complete virtual clock cycles of a cycle based simulation environment according to one embodiment of the present invention. The first virtual clock cycle 710 begins when virtual system clock 700 goes high. The cycle based simulation remains cycle accurate by instructing a component to call two functions during each clock cycle. If processor model 550 is in communication with memory model 560, for example, it may read data from memory model 560. During virtual system clock cycle 710, processor model 550 is instructed to execute the READ function. After processor model 550 has completed the execute phase of virtual system clock cycle 710, processor model 550 is instructed to update its variables.

The execute and update processes of a cycle based simulation provide cycle accurate information to the simulation environment. In turn, cycle accurate information provides enough detail to a system engineer to accurately validate the performance of a design. Advantageously, the cycle based simulation environment additionally executes significantly faster than event driven simulation environments.

2. Clock Functions

Clock functions may comprise the portion of the peer interface 540 that is responsible for synchronizing the computations of the individual components in a cycle based simulation environment. In one embodiment, each component in a virtual prototype that is configured with the virtual system clock may employ one or more clock functions. Examples of clock functions may include functions that advance simulation time once certain computations have been performed. For example, an execute function, an update function, and an advance function may be used to advance the virtual system clock in a simulation.

A registration function may also exist in the peer interface 540 to allow a design engineer to select the appropriate clock functions that correspond to the desired level of timing accuracy. The alternative clock functions (and combinations of clock functions) may provide several increasing levels of timing accuracy. A minimal level of timing accuracy may be provided by the scheduled synchronization level, for example, while a more robust level of timing accuracy may be provided by a single phase synchronization level. A cycle accurate level of timing accuracy may be provided by a two phase synchronization level.

The scheduled synchronization level, which provides minimal timing accuracy, may be used for certain components that remain inactive for extended periods of time, such as timer modules. The single phase synchronization level, which provides a more robust level of timing accuracy, may be employed between components that are loosely coupled together. A typical loose configuration may be, for example, a multiprocessor system in which the processors communicate through interrupts and shared memory. The two phase synchronization level, which provides the highest level of accuracy, may be used between tightly coupled components that are required to sustain cycle accurate simulation, such as components that directly access each other's registers.

In two phase synchronization, the execute and update functions may be employed to maintain cycle accurate information in the simulation environment. In one embodiment, each component configured for two phase synchronization runs both the execute and update functions in each virtual system clock cycle. For example, the simulation scheduler may first call the execute function of each component, during which any combinatorial logic instructions are performed and new values are computed. However, the design engineer may not make any assumptions about the order in which the individual components are called within the execute cycle. To the contrary, in this embodiment, the design engineer may only rely on the fact that the execute cycle is completed before the update cycle is called.

Once the execute function is complete, the simulation scheduler may call the update function of each component, during which any variables with new values are updated. This two phase synchronization model ensures that each component completes its tasks and updates its variables during each virtual system clock cycle, thereby allowing each component to provide accurate information during each clock cycle.

In one embodiment of the two phase synchronization mode, combinatorial logic instructions are not performed during the execute cycle, but are only performed during the update cycle. This scheduling of transactions advantageously allows a design engineer to ignore the order of the computations inside the component. Alternative methods may be used to structure the computations inside a component model to achieve cycle accurate behavior that is independent of the activation order of the component instances. Two examples of such alternative methods include a double buffering technique and a deferred transactions technique.

Figure 8:
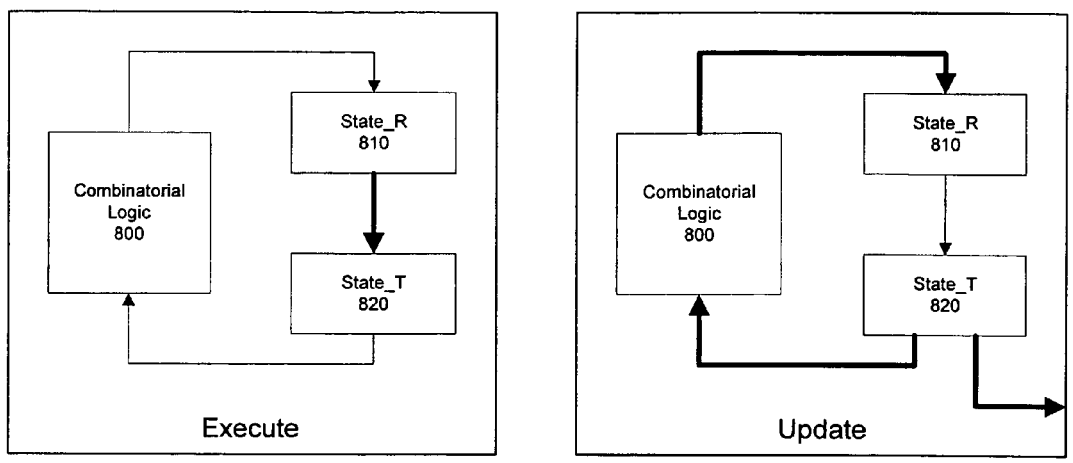
FIG. 8 is a block diagram illustrating a double buffering technique employed in a cycle based simulation environment with an execute and update event for each cycle according to one embodiment of the present invention.

FIG. 8 is a block diagram illustrating a component employing a double buffering technique according to one embodiment of the present invention. In the diagram, the execute and update phases are shown for a component connected with combinatorial logic block 800. The combinatorial logic block 800 may contain instructions that modify the value of a state variable. The component also has a real state variable 810 and a temporary state variable 820. The real state variable 810 may also be referred to as the master variable while the temporary state variable 820 may be referred to as the slave variable.

The double buffering technique maintains cycle accurate behavior by making a temporary copy of a state variable that is used in computations. The temporary state variable may allow the real state variable to be updated by the transactions performed by the component in the combinatorial logic block 800. For example, in the execute phase, a component may copy the value of the real state variable 810 into the value of the temporary state variable 820. Subsequently, in the update phase, the component may compute any new values for the real state variable based on the results of the combinatorial logic instructions the component runs during the update phase.

For example, in any computation or child function performed by the component in combinatorial logic block 800, the real state variable 810 may appear only on the left hand side of an assignment operator while the temporary state variable 820 may appear only on the right hand side of an assignment variable. This arrangement may ensure that any new values computed in combinatorial logic block 800 are stored in the real state variable 810. Additionally, this arrangement may ensure that the value of the temporary state variable 820 is not modified during the update phase. Advantageously, this may allow a state variable to remain constant during each clock cycle while also being updated. Additionally, this double buffering method enjoys the benefit that the system model remains internally hazard free, although extra memory and execution time are required for the data transfer.

Figure 9:
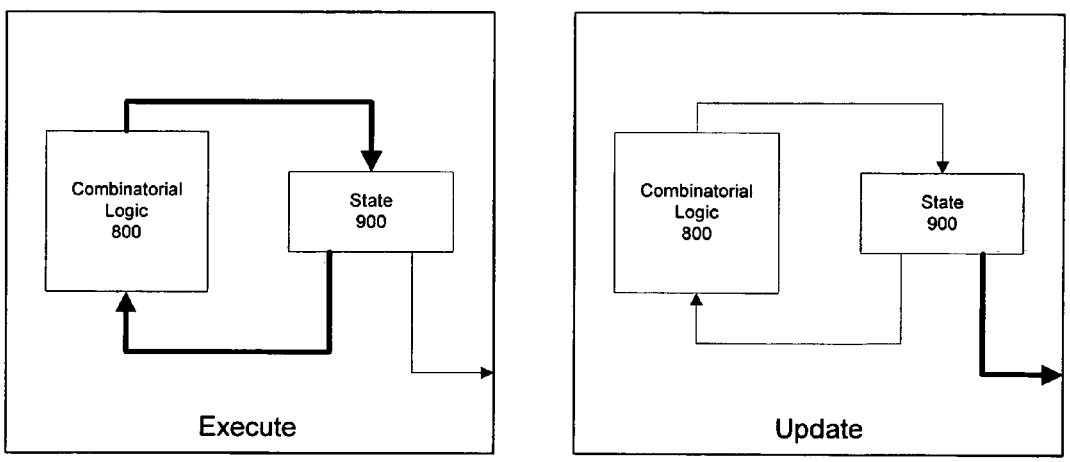
FIG. 9 is a block diagram illustrating a deferred transaction technique employed in a cycle based simulation environment with an execute and update event for each cycle according to one embodiment of the present invention.

FIG. 9 is a block diagram illustrating the deferred transaction technique according to one embodiment of the present invention. In the diagram, the execute and update phases are shown for a component connected with combinatorial logic block 800. The component also has a state variable 900. In one embodiment, the deferred transaction technique may only require a single copy of a state variable.

For example, a component employing the deferred transaction technique may execute the instructions in combinatorial logic block 800 and compute the next value of its state variable during the execute phase. Any transactions external to the component or child functions to be performed by the component are deferred to the update cycle. Advantageously, only one copy of the state variable 900 is required, thus decreasing the overall memory requirements for the simulation.

A disadvantage of this method may be that the order of the computations inside the execute phase become significant in retaining cycle accurate information. For example, a temporary variable may be introduced to facilitate the cross assignment of values between variables. However, although a potential internal component hazard with this method may exist, the deferred transaction method may perform faster and require less memory.

In an alternative embodiment, a virtual prototype may incorporate several discrete clocks with different clock frequencies. Synchronous clock trees may be constructed with the help of clock divider components that have several clock functions. These clock functions allow the clock divider component to synchronize with the master virtual system clock. Certain clock functions may allow the clock divider component to send output to or receive input from other clock related functions. For example, a clock divider component may act as a buffer between the master virtual system clock and a second discrete clock system. A clock divider component may also use several clock functions to drive one or more discrete clock systems.

Frequency division may be used to achieve an even ratio for the virtual master system clock and the discrete clock system. For example, every $n^{th}$ update and execute call may be passed by the clock divider component through to the discrete clock system. Fractional ratios may be implemented using a higher speed virtual system clock. A virtual prototype with discrete clock systems running at 300 Mhz and 400 Mhz, for example, could employ a master virtual system clock running at 1200 MHz. In this embodiment, the two discrete clock systems may be generated with 1:4 and 1:3 clock divider components. For closely spaced clock frequencies or asynchronous clocks, discrete clock systems may be approximated by dropping cycles from the higher speed virtual master system clock. For example, a 100 Mhz clock could be derived from a 101 MHz clock by skipping every 101 st call.

3. Signal Functions

Signal functions may handle all inter-component communications that do not conveniently fall into the access or clock category. A signal function may be described as a function that simply conveys a value down one or more physical wires. Complex data structures may also be transferred using signal functions. Examples of signal functions include interrupt functions and functions that enable the virtual system clock in a component.

One unique characteristic of signal functions is a propagating updating scheme. When a signal change is detected, each component that is affected by the change may be notified by a call to a signal function. The signal function may also perform other calculations and downstream transactions may be triggered. In this fashion, the original signal change may be propagated through several levels of combinatorial logic blocks. This propagation mechanism helps to enable a cycle accurate two phase synchronization scheme by guaranteeing that the system will converge into a steady state each cycle after the update and execute phases are complete.

IV. Unified Simulation

Figure 10:
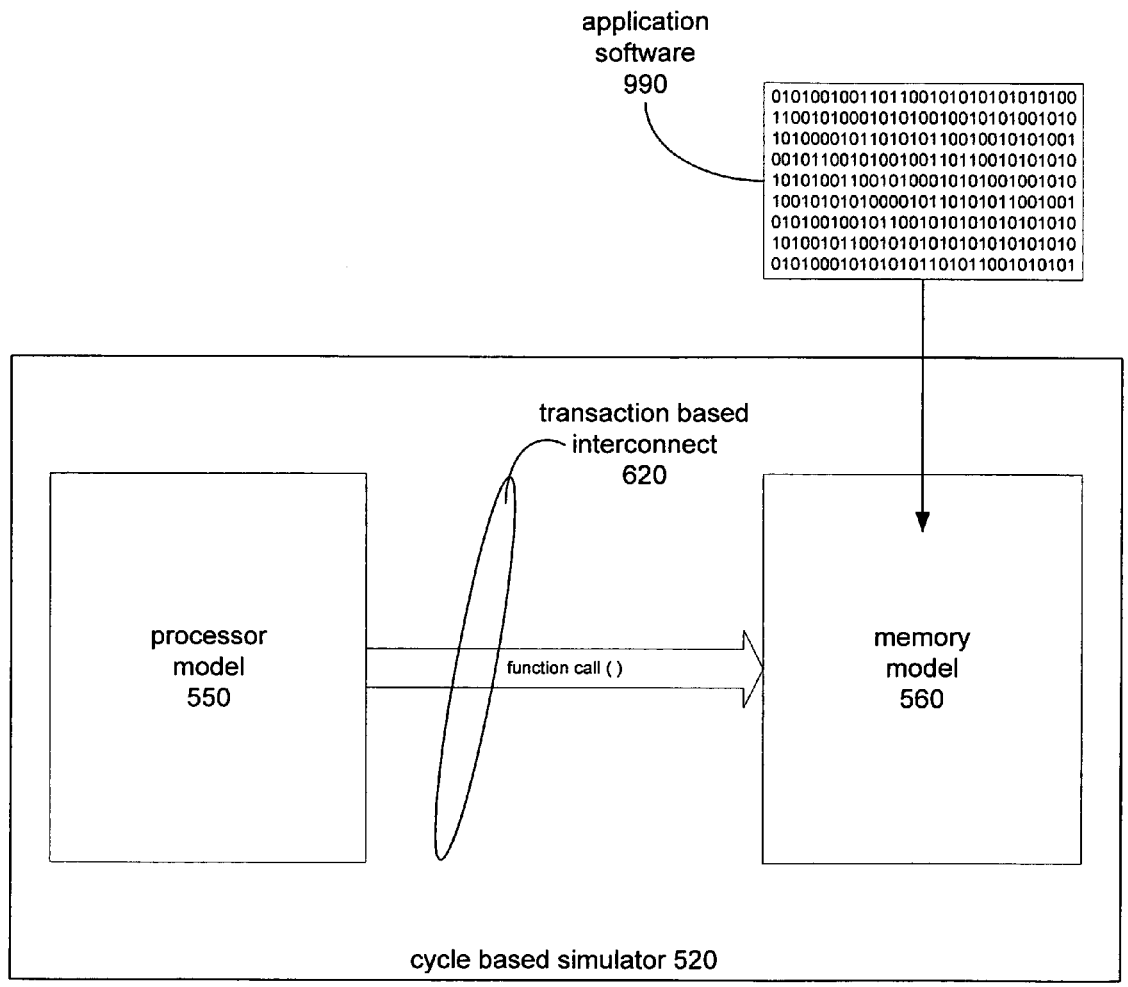
FIG. 10 is a block diagram illustrating a simulation environment for cycle accurate validation of the hardware and software components of a system design according to one embodiment of the present invention.

FIG. 10 is a block diagram illustrating a cycle based simulation environment for unified simulation of the hardware and software components of a system design according to one embodiment of the present invention. Cycle based simulator 520 may control the simulation and facilitate communication between the components of the system design. Processor model 550 and memory model 560 may be created in a high level general purpose programming language, for example C or C++. In one embodiment, these high level general purpose programming language component models may communicate using the function calls of transaction based interconnect 620.

For example, communication between the processor model 550 and the memory model 560 may take place through transaction based interconnect 620. Transaction based interconnect 620 may contain a plurality of functions that comprise a subset of the peer interface 540. Processor model 550 and memory model 560 may use these functions to perform simulation tasks such as reading from memory and writing to memory.

Additionally, application software 990 may be loaded into memory model 560. In one embodiment, processor model 550 performs the instructions contained in the application software 990 during execution of the system design in cycle based simulator 520. For example, the application software may be an RTOS that contains instructions for communicating with a peripheral device. Such instructions are well known in the art as device drivers. During the simulation, processor model 550 may request these instructions from memory model 560. Memory model 560, which has the application software loaded into its memory, may provide the instructions to requesting processor model 550. Subsequently, processor model 550 performs the instructions and communicates with the peripheral device during the simulation.

An advantage of a unified simulation in cycle based simulator 520 is the flexibility gained by creating the components of a system design in a high level general purpose programming language, such as C or C++. A particular advantage of using a high level general purpose programming language is the ability to use a transaction based interconnect 620 for communication between components. In one embodiment, the transaction based interconnect 620 may be comprised of a set of function calls, for example written in C or C++.

Use of the transaction based interconnect 620 may significantly reduce the total number of transactions in a simulation and thereby similarly reduce the total time necessary for a simulation to complete. Furthermore, the transaction based interconnect 620 may allow the cycle based simulator 520 to maintain cycle accurate behavior, which generates sufficiently detailed information to validate the performance of a system design, while significantly increasing the simulation speed.

In one embodiment, a unified simulation integrates the hardware and software components of a system design into a single cycle based simulation environment. For example, in a unified simulation, the system design may include a high level general purpose programming language model of the core processor and memory components. During simulation, the cycle based simulator 520 may load the application software 990 into the memory model 560 so that the software components can be contemporaneously simulated with the hardware components of the system design.

In an alternative embodiment, the cycle based simulation environment may run as a single process on the computer executing the simulation. This may allow a design engineer to run a debugger program during a simulation to check on the status of memory registers and other useful state information. For example, a design engineer may initialize a debugger program and notify the debugger program of the cycle based simulator 520 process. This may then allow the debugger program to access the memory being used by the components in the unified simulation. In turn, this may allow the design engineer to access critical debugging information about the system design being simulated.

While the particular method for accelerating hardware simulation herein shown and described in detail is fully capable of attaining the above described objects of this invention, it is to be understood that the description and drawings represent the presently preferred embodiment of the invention and are, as such, a representative of the subject matter which is broadly contemplated by the present invention. It is further understood that the scope of the present invention fully encompasses other embodiments that may become obvious to those skilled in the art, and that the scope of the present invention is accordingly limited by nothing other than the appended claims.

What is claimed is:

1. A computer implemented method for simulating a system design containing at least two components, said method comprising:
    identifying said components:
    creating models of said components in a high level general purpose programming language;
    creating a set of function calls in said high level general purpose programming language;
    combining said models to form a virtual prototype;
    linking one of said models with another of said models using said set of function calls;
    executing said virtual prototype, wherein said models communicate through a transaction based interconnect using said set of function calls and cycle accurate information is generated;
    wherein said generating cycle accurate information step further comprises:
        dividing activities in a simulation environment into a first plurality of activities comprising an execute phase and a second plurality of activities comprising an update phase;
        computing said first plurality of activities comprising said execute phase at a clock edge;
        updating at said clock edge a state of said simulation environment; and
        computing said second plurality of activities comprising said update phase at said clock edge.

2. A computer implemented method for simulating a digital system design in a cycle based simulation environment, comprising:
    creating a system design model in a high level general purpose programming language comprising at least two components;
    creating a transaction based interconnect in a high level general purpose programming language that is available to said at least two components;
    executing said system design model, wherein said at least two components communicate through said transaction based interconnect using a set of function calls; and
    maintaining cycle accurate information during the simulation;
    wherein said maintaining cycle accurate information step further comprises:
        dividing simulation activities in said simulation environment into a first plurality of activities comprising an execute phase and a second plurality of activities comprising an update phase;
        computing said first plurality of activities comprising said execute phase at a clock edge;
        updating at said clock edge a state of said simulation environment; and
        computing said second plurality of activities comprising said update phase at said clock edge.

3. A computer program product embodied on a computer-readable medium, which when executed, causes a processing system to simulate a system design containing at least two components, said computer program product comprising:
    instructions for integrating a model representing each of said at least two components, wherein said models comprise a virtual prototype and communicate through a transaction based interconnect using a set of function calls; and
    instructions for executing said virtual prototype to generate cycle accurate information;
    wherein said instructions for executing said virtual prototype to generate cycle accurate information further comprise:
        instructions for dividing simulation activities in a simulation environment into a first plurality of activities comprising an execute phase and a second plurality of activities comprising an update phase;
        instructions for computing said first plurality of activities comprising said execute phase at a clock edge;
        instructions for updating at said clock edge a state of said simulation environment; and
        instructions for computing said second plurality of activities comprising said update phase at said clock edge.

4. A computer implemented method for simulating a system design containing at least two components, said method comprising:
    identifying said components:
    creating models of said components in a high level general purpose programming language;
    creating a set of function calls in said high level general purpose programming language;
    combining said models to form a virtual prototype;
    linking one of said models with another of said models using said set of function calls;
    executing said virtual prototype, wherein said models communicate through a transaction based interconnect and cycle accurate information is generated, wherein said transaction based interconnect includes said set of function calls;
    wherein said generating cycle accurate information step further comprises:
        dividing activities in a simulation environment into a first plurality of activities comprising an execute phase and a second plurality of activities comprising an update phase;
        computing said first plurality of activities comprising said execute phase at a clock edge;
        updating at said clock edge a state of said simulation environment; and
        computing said second plurality of activities comprising said update phase at said clock edge.

5. A computer implemented method for simulating a digital system design in a cycle based simulation environment, comprising:
- creating a system design model in a high level general purpose programming language comprising at least two components;
- creating a transaction based interconnect in said high level general purpose programming language that is available to said at least two components;
- executing said system design model, wherein said at least two components communicate through said transaction based interconnect, wherein said transaction based interconnect includes a set of function calls; and
- maintaining cycle accurate information during the simulation;
- wherein said maintaining cycle accurate information step further comprises:
  - dividing simulation activities in said simulation environment into a first plurality of activities comprising an execute phase and a second plurality of activities comprising an update phase;
  - computing said first plurality of activities comprising said execute phase at a clock edge;
  - updating at said clock edge a state of said simulation environment; and
  - computing said second plurality of activities comprising said update phase at said clock edge.

6. A computer program product embodied on a computer-readable medium, which when executed, causes a processing system to simulate a system design within a cycle based simulation environment, said computer program product comprising:
- instructions for identifying at least two components in said system design;
- instructions for integrating models of said at least two components, wherein said models are created in a high level general purpose programming language;
- instructions for linking said models using a set of function calls created in said high level general purpose programming language; and
- instructions for executing said system design, wherein said models communicate through a transaction based interconnect using said set of function calls and cycle accurate information is generated, wherein said transaction based interconnect includes said set of function calls;
- wherein said instructions for generating cycle accurate information further comprise:
  - instructions for dividing simulation activities in said simulation environment into a first plurality of activities comprising an execute phase and a second plurality of activities comprising an update phase;
  - instructions for computing said first plurality of activities comprising said execute phase at a clock edge;
  - instructions for updating at said clock edge a state of said simulation environment; and
  - instructions for computing said second plurality of activities comprising said update phase at said clock edge.

7. A method for simulating a design containing at least two components, said method comprising:
- creating a model representing each of said at least two components, wherein said models comprise a virtual prototype and communicate through a transaction based interconnect, wherein said transaction based interconnect includes at least one function call; and
- executing said virtual prototype to generate cycle accurate information;
- wherein said executing step is performed in a cycle based simulation environment and said generating cycle accurate information step further comprises:
  - dividing activities in said cycle based simulation environment into a first plurality of activities comprising an execute phase and a second plurality of activities comprising an update phase;
  - computing said first plurality of activities comprising said execute phase at a clock edge;
  - updating at said clock edge a state of said simulation environment; and
  - computing said second plurality of activities comprising said update phase at said clock edge.

8. A computer program product embodied on a computer-readable medium, which when executed, causes a processing system to simulate a system design containing at least two components, said computer program product comprising:
- instructions for integrating a model representing each of said at least two components, wherein said models comprise a virtual prototype and communicate through a transaction based interconnect, wherein said transaction based interconnect includes a set of function calls; and
- instructions for executing said virtual prototype to generate cycle accurate information;
- wherein said instructions for executing said virtual prototype to generate cycle accurate information further comprise:
  - instructions for dividing simulation activities in said simulation environment into a first plurality of activities comprising an execute phase and a second plurality of activities comprising an update phase;
  - instructions for computing said first plurality of activities comprising said execute phase at a clock edge;
  - instructions for updating at said clock edge a state of said simulation environment; and
  - instructions for computing said second plurality of activities comprising said update phase at said clock edge.

\* \* \* \* \*